United States Patent
Chang et al.

(10) Patent No.: US 7,429,894 B2
(45) Date of Patent: Sep. 30, 2008

(54) POWER DEVICE HAVING CONNECTION STRUCTURE COMPENSATING FOR REACTANCE COMPONENT OF TRANSMISSION LINE

(75) Inventors: Woo Jin Chang, Daejeon (KR); Jae Kyoung Mun, Daejeon (KR); Haecheon Kim, Daejeon (KR); Jong Won Lim, Daejeon (KR); Hong Gu Ji, Daejeon (KR); Ho Kyun Ahn, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 93 days.

(21) Appl. No.: 11/519,668

(22) Filed: Sep. 12, 2006

(65) Prior Publication Data

US 2007/0132514 A1    Jun. 14, 2007

(30) Foreign Application Priority Data

Dec. 8, 2005    (KR) .................. 10-2005-0120039
May 10, 2006   (KR) .................. 10-2006-0041854

(51) Int. Cl.
*H03F 3/68* (2006.01)
(52) U.S. Cl. ................... 330/295; 330/124 R
(58) Field of Classification Search ........... 330/295, 330/124 R, 286, 307
See application file for complete search history.

(56) References Cited

U.S. PATENT DOCUMENTS

| | | | |
|---|---|---|---|
| 4,733,195 A * | 3/1988 | Tserng et al. | 330/286 |
| 5,106,778 A | 4/1992 | Hollis et al. | |
| 5,519,358 A | 5/1996 | Tserng | |
| 5,767,755 A | 6/1998 | Kim et al. | |
| 6,005,442 A | 12/1999 | Maeda et al. | |
| 6,650,180 B2 * | 11/2003 | Lautzenhiser et al. | 330/124 R |
| 6,747,517 B2 * | 6/2004 | Lautzenhiser et al. | 330/295 |
| 6,771,123 B2 * | 8/2004 | Pearce | 330/124 R |
| 6,965,128 B2 | 11/2005 | Holm et al. | |

FOREIGN PATENT DOCUMENTS

| | | |
|---|---|---|
| JP | 05-206763 | 8/1993 |
| JP | 2004-193039 | 7/2004 |
| KR | 10-0283520 | 12/2000 |
| KR | 10-0381685 | 4/2003 |

* cited by examiner

*Primary Examiner*—Henry K Choe
(74) *Attorney, Agent, or Firm*—Ladas & Parry LLP

(57) ABSTRACT

Provided is a power device having a connection structure compensating for a reactance component, in which transistors are arranged and connected to minimize deterioration of transistor properties caused by heat by compensating for a reactance component causing a phase difference due to transmission lines used for connecting a plurality of transistors in parallel such that the power device to be used for a high-frequency power amplifier outputs high power, and transmitting heat generated by high output power to a heat sink to be dissipated.

4 Claims, 3 Drawing Sheets

POWER DEVICE HAVING CONNECTION STRUCTURE COMPENSATING FOR REACTANCE COMPONENT OF TRANSMISSION LINE

CROSS-REFERENCE TO RELATED APPLICATION

This application claims priority to and the benefit of Korean Patent Application Nos. 2005-120039, filed Dec. 8, 2005 and 2006-41854, filed May 10, 2006, the disclosures of which are incorporated herein by reference in their entirety.

BACKGROUND

1. Field of the Invention

The present invention relates to a power device having a connection structure compensating for a reactance component of a transmission lines, and more particularly, to a power device in which transistors are arranged and connected to minimize deterioration of transistor properties caused by heat by compensating for a reactance component causing a phase difference due to transmission lines used for connecting a plurality of transistors in parallel, regardless of whether the number is odd or even, such that the power device to be used for a high-frequency power amplifier outputs high power, and transmitting heat generated by high output power to a heat sink to be dissipated.

2. Discussion of Related Art

To obtain high output power, transistors should be connected in parallel to fabricate a power device used for designing and fabricating a high-frequency power amplifier. Here, it is important by what method the transistors are connected when they are connected in parallel.

When the transistors are connected by transmission lines, the following matters should be considered.

First, signals input to the transistors should be in phase with signals output from the transistors. In other words, the input signals are transmitted to the transistors connected in parallel by the transmission lines, are amplified, outputs of the transistors are added up by the transmission lines, and then signals are output. Here, if the input signals are out-of-phase with the output signals, gain and output power are reduced.

Second, when a transistor used as a power device operates, a large amount of heat is generated. Therefore, to minimize reduction in gain and output power, deterioration of transistor properties caused by heat should be minimized, and the heat should be effectively emitted outside.

Third, the power device should be connected for easy design of a circuit to obtain desired output power when a power amplifier circuit is designed.

Fourth, the size of the power device should be considered.

To address the above issues, transistors should be connected in parallel as shown in FIGS. 2 and 3 to fabricate the power device used for designing and fabricating a conventional high-frequency power amplifier.

In FIG. 2, the power device comprises four transistors 215, 217, 219 and 221 connected in parallel by transmission lines, and heat sinks (not shown) dissipating heat generated when the transistors operate through via holes 214, 216, 218, 220 and 222 formed on one side of the transistors 215, 217, 219 and 221.

Here, between adjacent transistors, only one heat sink dissipating heat through the via holes on one side of the transistors is formed.

Also, since input and output transmission lines connecting the first to fourth transistors 215, 217, 219, and 221 have a tree or branch structure, signals input to the transistors are in phase with signals output from the transistors.

With respect to RF input transmission lines, the length of the transmission line connected to an input stage of the first transistor 215 is equal to the sum of the lengths of transmission lines 201, 202, 203, 204, and 205: the length of the transmission line connected to the input stage of the second transistor 217 is equal to the sum of the lengths of transmission lines 201, 202, 203, 206 and 207; the length of the transmission line connected to the input stage of the third transistor 219 is equal to the sum of the lengths of transmission lines 201, 208, 209, 210 and 211; and the length of the transmission line connected to the input stage of the fourth transistor 221 is equal to the sum of the lengths of transmission lines 201, 208, 209, 212 and 213.

Here, the transmission line 202 has the same length as the transmission line 208; the transmission line 203 has the same length as the transmission line 209; the lengths of the transmission lines 204, 206, 210 and 212 are equal: and also, the lengths of the transmission lines 205, 207, 211 and 213 are equal. As a result, all of the lengths of the transmission lines connected to input stages of the first to fourth transistors 215, 217, 219, and 221 are equal.

Therefore, signals input to the first to fourth transistors 215, 217, 219 and 221 are in phase with each other, and also, signals obtaining gain and output power from each transistor are in phase with each other.

In addition, with respect to RF output transmission lines, the length of the transmission line connected to an output stage of the first transistor 215 is equal to the sum of the lengths of transmission lines 223, 224, 225, 233 and 235; the length of the transmission line connected to the output stage of the second transistor 217 is equal to the sum of the lengths of transmission lines 227, 226, 225, 233 and 235; the length of the transmission line connected to the output stage of the third transistor 219 is equal to the sum of the lengths of transmission lines 228, 229, 230, 234 and 235; and the length of the transmission line connected to the output stage of the fourth transistor 221 is equal to the sum of the lengths of transmission lines 232, 231, 230, 234 and 235.

Here, the lengths of the transmission lines 223, 227, 228 and 232 are equal, the lengths of the transmission lines 224, 226, 229 and 231 are equal, the length of the transmission line 225 is equal to that of the transmission line 230, and the length of the transmission line 233 is equal to that of the transmission line 234. Therefore, all of the lengths of the transmission lines connected to output stages of the first to fourth transistors 215, 217, 219, and 221 are equal.

Therefore, the signal input from the transmission line 201 is in phase with the signals output from the first to fourth transistors 215, 217, 219, and 221 and reaching the transmission line 235, and its gain is not reduced.

If the first to fourth transistors 215, 217, 219, and 221 are in phase with each other, the output power is four times greater than the signal input without reduction.

However, the power device having the above structure has the following disadvantages. Since the first to fourth transistors 215, 217, 219, and 221 are closely disposed, adjacent transistors are deteriorated by heat generated from the transistors, gain and output power are easily reduced, and only an even number of transistors may be fabricated into a power device.

Referring to another embodiment shown in FIG. 3, a power device comprises four transistors 308, 310, 313 and 315 connected in parallel by transmission lines, and heat sinks (not shown) dissipating heat generated when the transistors operate through via holes 307, 309, 311, 312, 314 and 316 formed on one side of the four transistors 308, 310, 313 and 315.

In FIG. 3, the fifth to eighth transistors 308, 310, 313 and 315 are disposed rotated by 90 degrees, and 270 degrees, and while the lengths of input transmission lines of the transistors are different from those of output transmission lines of the transistors, the lengths of the input and output transmission lines of the transistors are equal, and thus, the transistors are in phase with each other, which is different from the embodiment of FIG. 2.

Here, with respect to the heat sinks dissipating heat through the via holes formed on one side of the transistors, only one heat sink is formed between adjacent transistors.

Also, the input and output transmission lines connecting the fifth to eighth transistors 308, 310, 313 and 315 have the following structures.

With respect to RF input transmission lines, the length of the transmission line connected to the input stage of the fifth transistor 308 is equal to the sum of the lengths of transmission lines 301 and 302: the length of the transmission line connected to the input stage of the sixth transistor 310 is equal to the sum of the lengths of transmission lines 301, 304 and 305; the length of the transmission line connected to the input stage of the seventh transistor 313 is equal to the sum of the lengths of transmission lines 301 and 303; and the length of the transmission line connected to the input stage of the eighth transistor 315 is equal to the sum of the lengths of transmission lines 301, 304 and 306.

Here, since lengths of the transmission lines 302, 303, 305 and 306 are equal, the lengths of the transmission lines connected to the input stages of the fifth and seventh transistors 308 and 313 are equal, and the lengths of the transmission lines connected to the input stages of the sixth and eighth transistors 310 and 315 are equal.

In other words, signals input to the fifth transistor 308 and the seventh transistor 313 are in phase with each other, and also, signals input to the sixth transistor 310 and the eighth transistor 315 are in phase with each other.

However, the phase difference between the signals input to the fifth and seventh transistors 308 and 313 and the signals input to the sixth and eighth transistors 310 and 315 is equal to the length of the transmission line 304.

Furthermore, with respect to RF output transmission lines, a length of the transmission line connected to the output stage of the fifth transistor 308 is equal to the sum of the lengths of transmission lines 317, 318, 320, 325 and 327; the length of the transmission line connected to the output stage of the sixth transistor 310 is equal to the sum of the lengths of transmission lines 319, 320, 325 and 327; the length of the transmission line connected to the output stage of the seventh transistor 313 is equal to the sum of the lengths of transmission lines 321, 322, 324, 326 and 327; and the length of the transmission line connected to the output stage of the eighth transistor 315 is equal to the sum of the lengths of transmission lines 323, 324, 326 and 327.

Here, since the lengths of the transmission lines 317, 319, 321 and 323 are equal, the length of the transmission line 318 is equal to that of the transmission line 322, and the length of the transmission line 320 is equal to that of the transmission line 324, the lengths of the transmission lines connected to the output stages of the fifth and seventh transistors 308 and 313 are equal, and the lengths of the transmission lines connected to the output stages of the sixth and eighth transistors 310 and 315 are equal.

In other words, the signal output from the fifth transistor 308 is in phase with the signal output from the seventh transistor 313, and the signal output from the sixth transistor 310 is in phase with the signal output from the eighth transistor 315.

However, a phase difference between the signals output from the fifth and seventh transistors 308 and 313 and the signals output from the sixth and eighth transistors 310 and 315 is equal to the sum of the lengths of the transmission lines 318 and 322.

As described above, the lengths of the input transmission lines of the fifth and seventh transistors 308 and 313 are shorter than those of the input transmission lines of the sixth and eighth transistors 310 and 315, which are as long as the length of the transmission line 304. However, the lengths of the output transmission lines of the fifth and seventh transistors 308 and 313 are longer than those of the output transmission lines of the sixth and eighth transistors 310 and 315, which are as long as the sum of the lengths of the transmission lines 318 and 322.

As a result, the length of the input transmission line 304 is equal to the sum of the lengths of the output transmission lines 318 and 322. Thus, all of the input and output transmission lines of the fifth to eighth transistors 308, 310, 313 and 315 are equal.

Therefore, if the signal input from the transmission line 301 is in phase with the signals output from the fifth to eighth transistors 308, 310, 313 and 315 that reach the transmission line 327 without reduction in gain, and the fifth to eighth transistors 308, 310, 313 and 315 are equal, the output power is four times greater than the signal input without reduction.

However, the structure illustrated in FIG. 3 has the following disadvantages. Since the fifth and sixth transistors 308 and 310, and the seventh and eighth transistors 313 and 315 are respectively rotated 90 degrees, and 270 degrees, designing a power amplifier circuit is limited, and only an even number of transistors may be fabricated as a power device.

As described above, a conventional power device used for designing and fabricating a high-frequency power amplifier has the following problems.

First, gain and output power are reduced due to deterioration of transistors.

Second, designs are limited due to the rotated locations of the transistors.

Third, it is not possible to fabricate a power device using an odd number of the transistors.

Fourth, since there is only one via hole connected by a heat sink dissipating heat between neighboring transistors, it is difficult to sufficiently dissipate heat generated when the transistors operate.

SUMMARY OF THE INVENTION

The present invention is directed to a power device capable of outputting high power through a connection structure compensating for a reactance component of a transmission line.

The present invention is also directed to a power device in which transistors are arranged and connected to minimize deterioration of transistor properties caused by heat by compensating for a reactance component causing a phase difference due to transmission lines used for connecting a plurality of transistors in parallel, regardless of whether the number is odd or even, and transmitting heat generated by high output power to a heat sink to be dissipated.

One aspect of the present invention provides a power device having a connection structure compensating for a reactance component including: transmission lines having a parallelogram ladder structure and including input and output lines formed at diagonally opposite corners; a plurality of transistors connected in parallel by the transmission lines; and a heat sink dissipating heat generated when the transistors operate through via holes formed on both sides of the transistors.

The plurality of transistors may be disposed not to overlap the via holes.

The plurality of transistors may be odd or even in number.

The length sum of the input transmission lines is equal to that of the output transmission lines.

The via holes that are formed on each transistor may be two or more in number.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Hereinafter, an exemplary embodiment of a power device having a connection structure compensating for a reactance component according to the present invention will be described with reference to an accompanying drawing.

Figure 1:
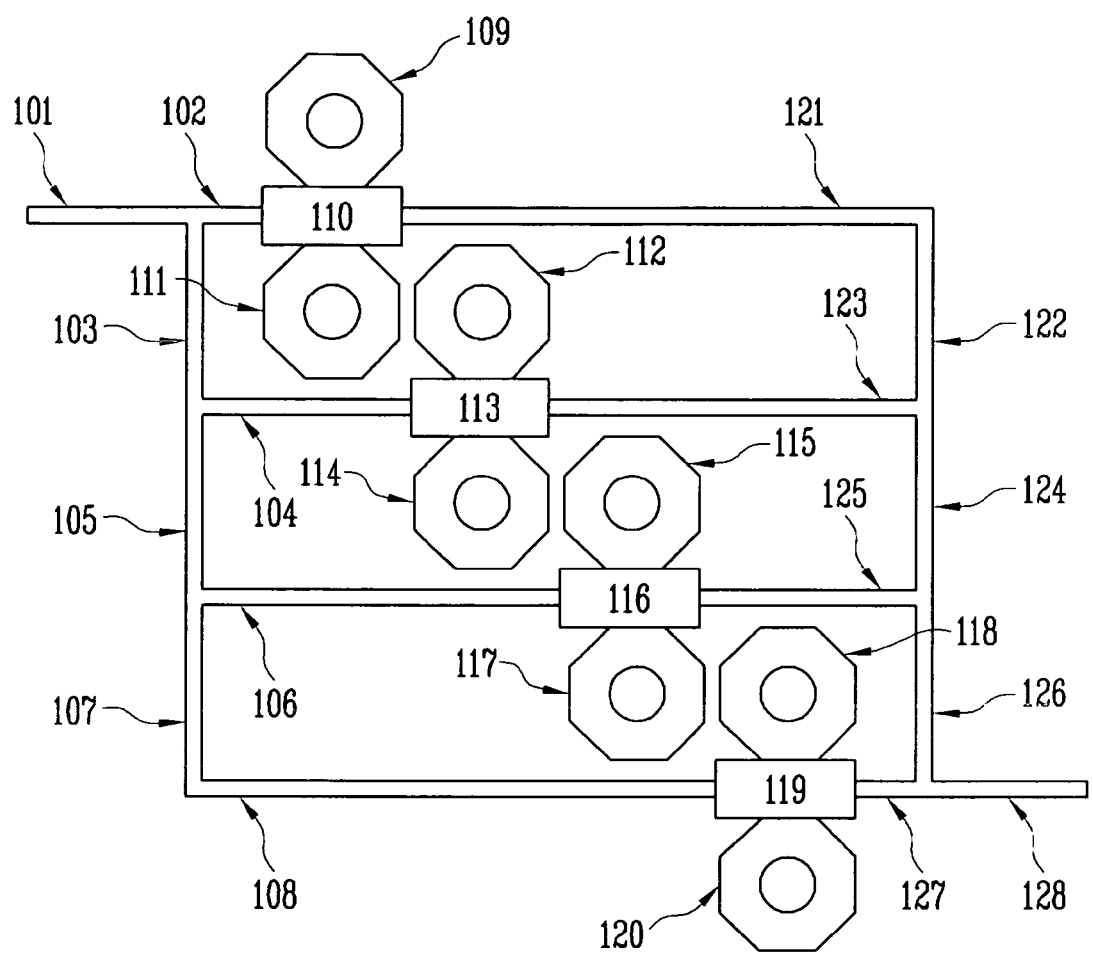
FIG. 1 illustrates the configuration of a power device having a connection structure compensating for a reactance component according to an exemplary embodiment of the present invention.
Figure 2:
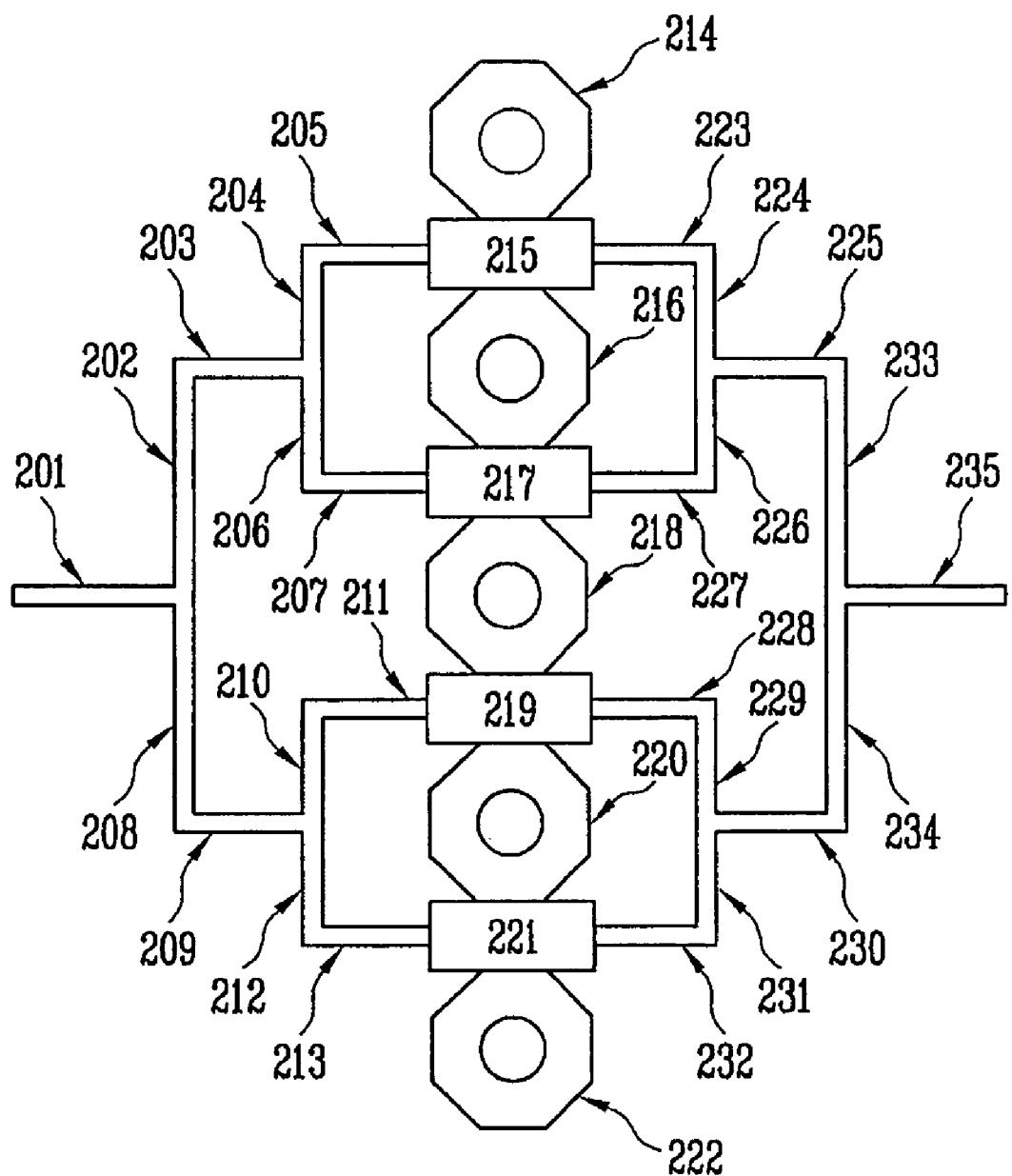
FIG. 2 illustrates a first configuration of a conventional power device having a connection structure compensating for a reactance component.
Figure 3:
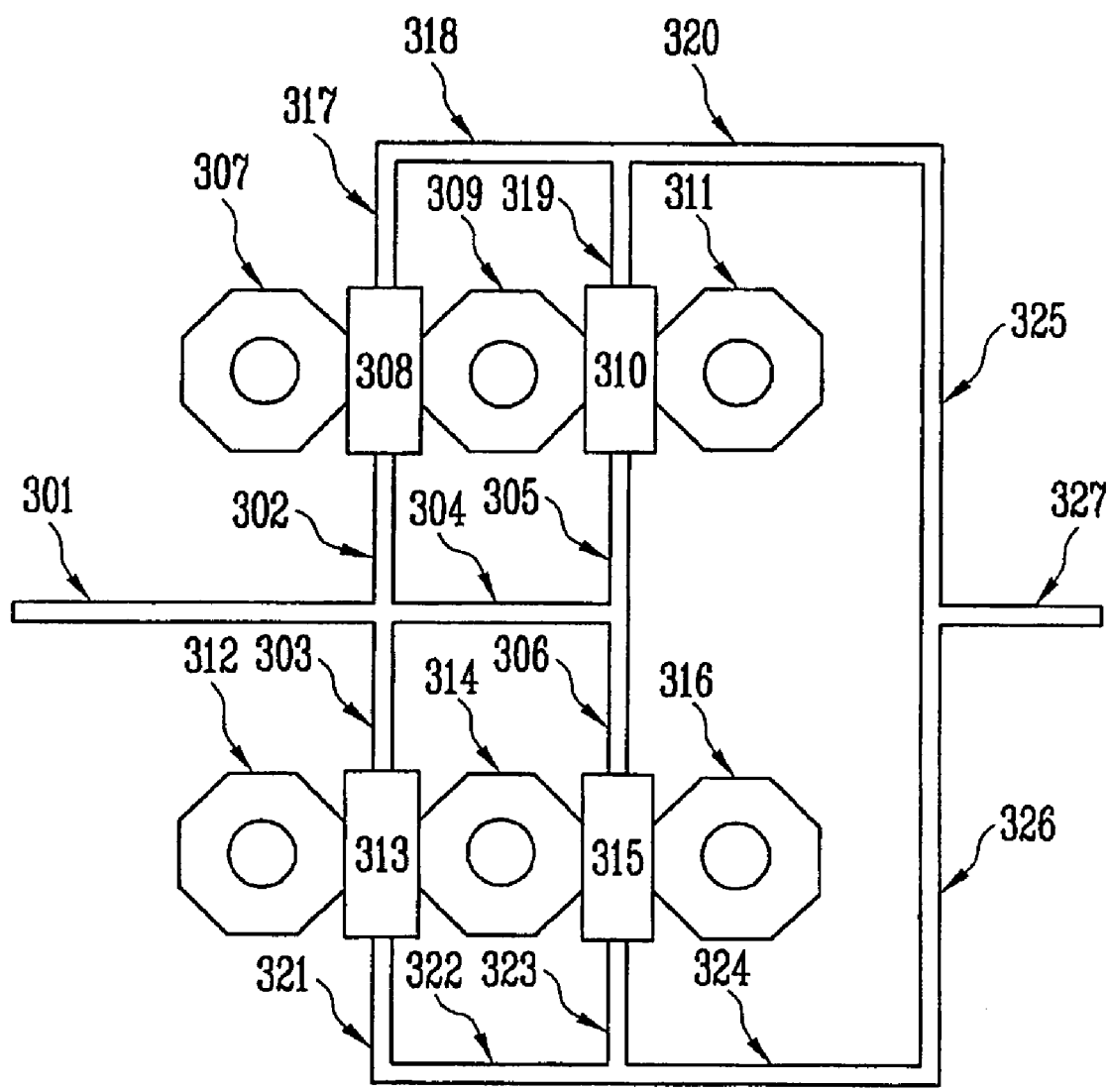
FIG. 3 illustrates a second configuration of a conventional power device having a connection structure compensating for a reactance component.

FIG. 1 shows a power device having a connection structure compensating for the reactance component according to an exemplary embodiment of the present invention.

As shown in FIG. 1, the power device includes input and output transmission lines formed at diagonally opposite corners in a parallelogram ladder structure, ninth to twelfth transistors 110, 113, 116 and 119 connected in parallel by the transmission lines, and heat sinks (not shown) dissipating heat generated when the transistors operate, through via holes 109, 111, 112, 114, 115, 117, 118 and 120 formed on both sides of the transistors.

Here, a pair of the via holes 109 and 111 are formed on both sides of the transistor 110; a pair of the via holes 112 and 114 are formed on both sides of the transistor 113; a pair of the via holes 115 and 117 are formed on both sides of the transistor 116; and a pair of the via holes 118 and 120 are formed on both sides of the transistor 119. However, two more via holes can be formed on a transistor. Also, a plurality of transistors may be odd or even in number.

In addition, while lengths of input lines 101 to 108 and output lines 121 to 128 of the transistors are different from each other, the length sum of the input lines is equal to that of the output lines, and thus, the transistors are in phase with each other.

The configuration of the input and output transmission lines connecting the transistors will be described in more detail below.

With respect to RF input transmission lines, the length of a transmission line connected to the input stage of the ninth transistor 110 is equal to the sum of the lengths of transmission lines 101 and 102; the length of the transmission line connected to the input stage of the tenth transistor 113 is equal to the sum of the lengths of transmission lines 101, 103 and 104; the length of the transmission line connected to the input stage of the eleventh transistor 116 is equal to the sum of the lengths of transmission lines 101, 103, 105 and 106; and the length of the transmission line connected to the input stage of the twelfth transistor 119 is equal to the sum of the lengths of transmission lines 101, 103, 105, 107 and 108.

Here, the lengths of the transmission lines 103, 105 and 107 may be equal or different from each other.

Accordingly, signals input to the ninth to twelfth transistors 110, 113, 116 and 119 are in phase with each other, and the phase difference between the signals is equal to the sum of the lengths of the transmission lines 102, 104, 106 and 108.

Furthermore, with respect to RF output transmission lines, the length of a transmission line connected to an output stage of the ninth transistor 110 is the sum of the lengths of transmission lines 121, 122, 124, 126 and 128; the length of the transmission line connected to the output stage of the tenth transistor 113 is the sum of the lengths of transmission lines 123, 124, 126 and 128; the length of the transmission line connected to the output stage of the eleventh transistor 116 is the sum of the length of transmission lines 125, 126 and 128; and the length of the transmission line connected to the output stage of the twelfth transistor 119 is the sum of the lengths of transmission lines 127 and 128.

Here, the lengths of the transmission lines 122, 124 and 126 may be equal or different from each other.

Accordingly, signals from the ninth to twelfth transistors 110, 113, 116 and 119 are out-of-phase with each other, and the phase difference between signals is equal to the sum of the lengths of the transmission lines 121. 123, 125 and 127.

However, the length of the input transmission line 102 is equal to that of the output transmission line 127, the length of the input transmission line 104 is equal to that of the output transmission line 125, the length of the input transmission line 106 is equal to that of the output transmission line 123, and the length of the input transmission line 108 is equal to that of the output transmission line 121.

As a result, the length sum of the input lines and that of the output lines of the ninth to twelfth transistors 110, 113, 116 and 119 are equal.

Therefore, if the signal input from the transmission line 101 is in phase with the signal output from the ninth to twelfth transistors 110, 113, 116 and 119, and reaching the transmission line 128 without reduction in gain, and the ninth to twelfth transistors 110, 113, 116 and 119 are equal, output power is four times greater than the signal input without reduction.

In addition, the power device having the above configuration may be fabricated using an odd number of transistors, since output signals are in phase with each other.

Therefore, disadvantages of the conventional devices such as reduction in gain and output power due to deterioration of transistors, design restrictions due to rotated locations of the transistors, and impossibility of fabrication of the power device using an odd number of transistors may be overcome.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A power device, comprising:

transmission lines having a parallelogram ladder structure and including input and output lines formed at diagonally opposite corners;

a plurality of transistors connected in parallel by the transmission lines; and a heat sink dissipating heat generated when the transistors operate through via holes formed on sides of the transistors, the via holes comprising:

a first via hole formed on a first side of each transistor of the plurality of transistors; and a second via hole formed on a second side opposite the first side of each transistor of the plurality of transistors, wherein the plurality of transistors having the via holes on the sides thereof are disposed in a staggered pattern having a 2-dimensional structure such that the via holes formed on the sides of neighboring transistors do not overlap each other and the size of the power device is reduced.

2. The power device according to claim 1, wherein the plurality of transistors are either odd or even in number.

3. The power device according to claim 1, wherein the length sum of the input lines is equal to that of the output lines.

4. The power device according to claim 1, wherein the via holes that are formed on the sides of the transistors are two or more in number.

* * * * *